(12) United States Patent
Hsueh et al.

(10) Patent No.: US 10,431,454 B2
(45) Date of Patent: Oct. 1, 2019

(54) SEMICONDUCTOR SUBSTRATE AND MANUFACTURING METHOD THEREOF

(71) Applicant: Nuvoton Technology Corporation, Hsinchu (TW)

(72) Inventors: Fang-Chang Hsueh, Hsinchu (TW); Heng-Kuang Lin, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/056,545

(22) Filed: Aug. 7, 2018

(65) Prior Publication Data

US 2019/0051522 A1 Feb. 14, 2019

(30) Foreign Application Priority Data

Aug. 10, 2017 (TW) .............................. 106127015 A

(51) Int. Cl.
| | |
|---|---|
| *H01L 21/02* | (2006.01) |
| *H01L 29/20* | (2006.01) |
| *H01L 29/205* | (2006.01) |
| *H01L 33/00* | (2010.01) |
| *H01L 29/10* | (2006.01) |
| H01L 29/778 | (2006.01) |

(Continued)

(52) U.S. Cl.
CPC .... *H01L 21/02458* (2013.01); *H01L 21/0254* (2013.01); *H01L 21/02505* (2013.01); *H01L 21/02639* (2013.01); *H01L 29/1075* (2013.01); *H01L 29/2003* (2013.01); *H01L 29/205* (2013.01); *H01L 33/007* (2013.01); *H01L 21/266* (2013.01); *H01L 21/2654* (2013.01); *H01L 29/7786* (2013.01)

(58) Field of Classification Search
CPC ......... H01L 21/02436; H01L 21/02518; H01L 29/66007; H01L 29/66053
See application file for complete search history.

(56) References Cited

U.S. PATENT DOCUMENTS

| | | | | |
|---|---|---|---|---|
| 6,153,010 | A | * | 11/2000 | Kiyoku ................. B82Y 20/00 117/106 |
| 7,101,444 | B2 | | 9/2006 | Shchukin et al. |
| 8,704,273 | B2 | | 4/2014 | Okamoto et al. |

(Continued)

FOREIGN PATENT DOCUMENTS

| | | |
|---|---|---|
| CN | 1489222 | 4/2004 |
| CN | 101924104 | 12/2010 |
| TW | 201448230 | 12/2014 |

OTHER PUBLICATIONS

Peter Moens et al., "On the Impact of Carbon-Doping on the Dynamic Ron and Off-state Leakage Current of 650V GaN Power Devices", Proceedings of the 27th International Symposium on Power Semiconductor Devices & IC's, Jun. 2015, pp. 1-5.

*Primary Examiner* — Cheung Lee
(74) *Attorney, Agent, or Firm* — JCIPRNET

(57) ABSTRACT

A semiconductor substrate and a manufacturing method thereof are provided. The semiconductor substrate includes a base, a buffer layer, a mask layer and a first GaN layer. The buffer layer is disposed on the base, wherein doped regions are disposed in a portion of the surface of the buffer layer. The mask layer is disposed on the buffer layer and located on the doped regions. The first GaN layer is disposed on the buffer layer and covers the mask layer.

11 Claims, 5 Drawing Sheets

(51) Int. Cl.
*H01L 21/266* (2006.01)
*H01L 21/265* (2006.01)

(56) References Cited

U.S. PATENT DOCUMENTS

| | | | |
|---|---|---|---|
| 8,853,749 B2 | 10/2014 | Lidow et al. | |
| 2002/0117104 A1* | 8/2002 | Hata | B82Y 20/00 117/97 |
| 2011/0227037 A1* | 9/2011 | Su | C23C 16/0227 257/13 |
| 2014/0264379 A1 | 9/2014 | Kub et al. | |
| 2016/0020276 A1* | 1/2016 | Lu | H01L 29/0653 257/77 |

* cited by examiner

SEMICONDUCTOR SUBSTRATE AND MANUFACTURING METHOD THEREOF

CROSS-REFERENCE TO RELATED APPLICATION

This application claims the priority benefit of Taiwan application no. 106127015, filed on Aug. 10, 2017. The entirety of the above-mentioned patent application is hereby incorporated by reference herein and made a part of this specification.

BACKGROUND

Field of the Invention

The invention relates to a semiconductor device and more particularly, to a semiconductor substrate.

Description of Related Art

Regarding GaN-based semiconductor devices, they have been gradually widely applied as having advantages of high electron mobility, a high withstand voltage, a low channel resistance and capability of fast switching. In a manufacturing process of a GaN-based semiconductor device, a buffer layer on a base is usually doped with carbon to increase a resistance of the buffer layer, thereby reducing a leakage current of the GaN-based semiconductor device which is easily generated when the GaN-based semiconductor device is operated.

However, even though the buffer layer doped with carbon has the higher resistance, the buffer layer doped with carbon has defects, and such defects form carrier trapping points. In this way, an issue of current collapse is subjected to occur to the GaN-based semiconductor device, when being operated.

SUMMARY

The invention provides a semiconductor substrate having a buffer layer with higher resistance and a GaN layer with preferable quality.

The invention provides a manufacturing method of a semiconductor substrate for manufacturing a semiconductor substrate having a buffer layer with higher resistance and a GaN layer with preferable quality.

A semiconductor substrate of the invention includes a base, a buffer layer, a mask layer and a first GaN layer. The buffer layer is disposed on the base, wherein doped regions are disposed in a portion of a surface of the buffer layer. The mask layer is disposed on the buffer layer and located on the doped regions. The first GaN layer is disposed on the buffer layer and covers the mask layer.

A semiconductor substrate of the invention includes a base, a buffer layer, a first mask layer, a first GaN layer, a second mask layer and a second GaN layer. The buffer layer is disposed on the base, wherein doped regions are disposed in an overall surface of the buffer layer. The first mask layer is disposed on the buffer layer and exposes a portion of the doped regions. The first GaN layer is disposed on the buffer layer and covers the first mask layer. The second mask layer is disposed on the first GaN layer and located on the doped regions which are not covered by the first mask layer. The second GaN layer is disposed on the first GaN layer and covers the second mask layer.

In an embodiment of the semiconductor substrate of the invention, a dopant of the doped regions includes, for example, neutral atoms.

In an embodiment of the semiconductor substrate of the invention, the neutral atoms include, for example, N or Ar.

In an embodiment of the semiconductor substrate of the invention, the base includes, for example, a Si base, a SiC base, a sapphire base or a GaN base.

In an embodiment of the semiconductor substrate of the invention, a material of the buffer layer includes, for example, GaN, AlGaN, InGaN or AlInGaN.

In an embodiment of the semiconductor substrate of the invention, the semiconductor substrate further includes a second GaN layer disposed between the buffer layer and the first GaN layer.

A manufacturing method of a semiconductor substrate of the invention includes: forming a buffer layer on a base; forming doped regions in a portion of a surface of the buffer layer; forming a mask layer on the buffer layer, wherein the mask layer is located on the doped regions; and forming a first GaN layer on the buffer layer, wherein the first GaN layer covers the mask layer.

In an embodiment of the manufacturing method of the semiconductor substrate of the invention, after the doped regions are formed, and before the mask layer is formed, the manufacturing method further includes forming a second GaN layer on the buffer layer.

A manufacturing method of a semiconductor substrate of the invention includes: forming a buffer layer on a base; forming doped regions in an overall surface of the buffer layer; forming a first mask layer on the buffer layer, wherein the first mask layer exposes a portion of the doped regions; forming a first GaN layer on the buffer layer, wherein the buffer layer covers the first mask layer; forming a second mask layer on the first GaN layer, wherein the second mask layer is located on the doped regions which are not covered by the first mask layer; and forming a second GaN layer on the first GaN layer, wherein the second GaN layer covers the second mask layer.

In an embodiment of the manufacturing method of the semiconductor substrate of the invention, a dopant of the doped regions includes, for example, neutral atoms.

In an embodiment of the manufacturing method of the semiconductor substrate of the invention, the neutral atoms include, for example, N or Ar.

In an embodiment of the manufacturing method of the semiconductor substrate of the invention, a method of forming the first GaN layer includes, for example, performing an epitaxial growing process.

In an embodiment of the manufacturing method of the semiconductor substrate of the invention, a method of forming the second GaN layer includes, for example, performing an epitaxial growing process.

Based on the above, in the invention, implanting the neutral atoms into the buffer layer can contribute to amorphization of the buffer layer that the buffer layer can have a higher resistance, and thereby, a finally formed device can have a lower leakage current. Moreover, in the invention, as the regions of the GaN layer with poor quality are first covered by the mask layer, and the epitaxial growing process is further performed to form another GaN layer, the finally formed GaN layer can have better quality.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
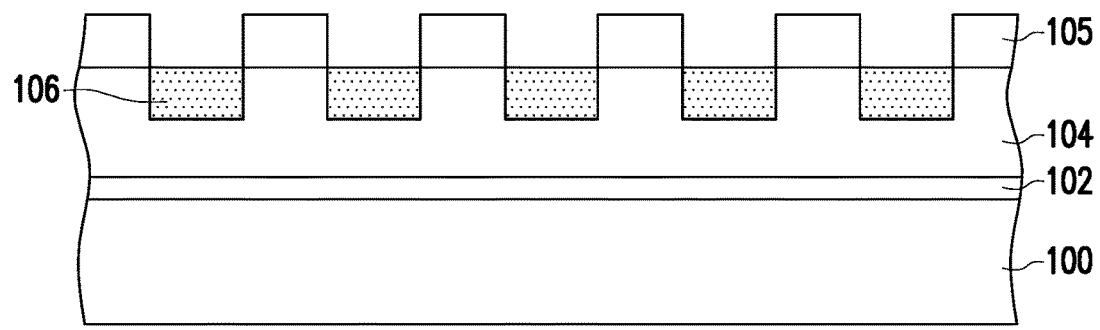
FIG. 1A to FIG. 1C are schematic cross-sectional views of a manufacturing method of a semiconductor substrate according to a first embodiment of the invention.
Figure 1B:
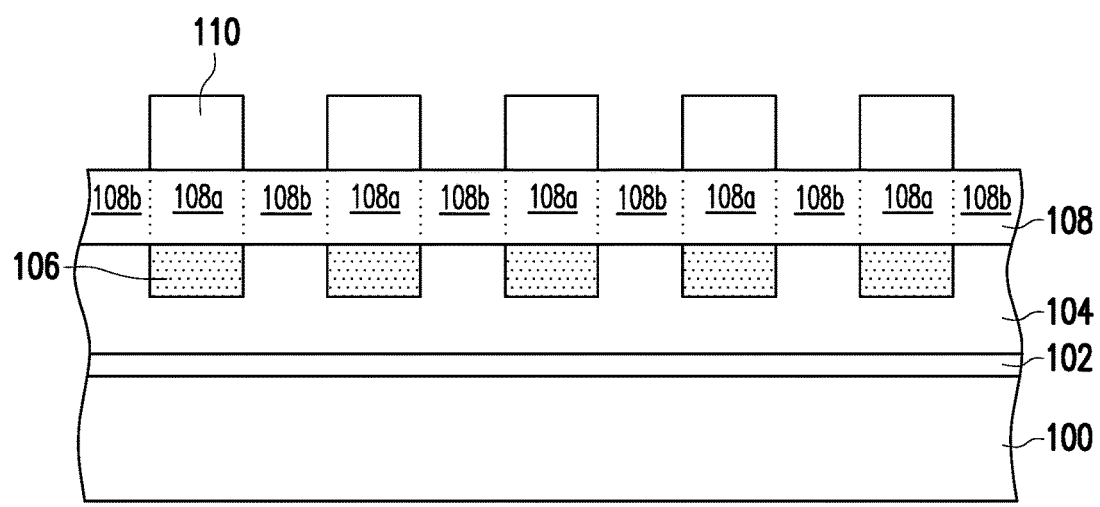
Figure 1C:
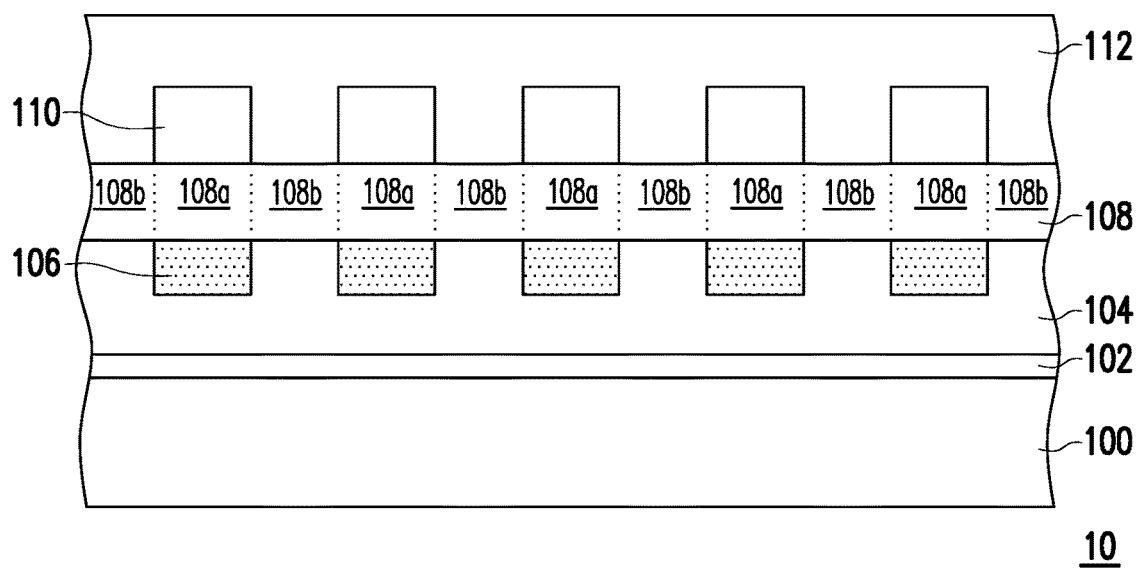

FIG. 1A to FIG. 1C are schematic cross-sectional views of a manufacturing method of a semiconductor substrate according to a first embodiment of the invention. First, referring to FIG. 1A, a base 100 is provided. The base 100 is, for example, a Si base, a SiC base, a sapphire base or a GaN base. Then, a nucleation layer 102 is selectively formed on the base 100. A material of the nucleation layer 102 includes, for example, AlN. A method of forming the nucleation layer 102 includes, for example, performing a chemical vapor deposition (CVD) process. A thickness of the nucleation layer 102 is, for example, between 10 nm and 500 nm. Thereafter, a buffer layer 104 is formed on the nucleation layer 102. A material of the buffer layer 10 includes, for example, GaN, AlGaN, InGaN or AlInGaN. A method of forming the buffer layer 104 includes, for example, performing an epitaxial growing process. A thickness of the buffer layer 104 is, for example, between 100 nm and 10 μm.

After the buffer layer 104 is formed, a mask layer 105 exposing a portion of a surface of the buffer layer 104 is formed on the buffer layer 104. Then, by using the mask layer 105 as a mask, an implantation process is performed to implant neutral atoms into the portion of the surface of the buffer layer 104, so as to form doped regions 106. In the present embodiment, the neutral atoms include, for example, N or Ar. After the neutral atoms are implanted, the buffer layer 104 may be amorphized, such that the buffer layer 104 has a higher resistance, and a finally formed device may have a lower leakage current. Additionally, in the present embodiment, only the neutral atoms are implanted into the surface of the buffer layer 104, but a depth of the doped regions 106 is not limited in the invention. In other embodiments, the neutral atoms may also be implanted deeply into the bottom of the buffer layer 104. Namely, the depth of formed doped regions 106 may be equal to the thickness of the buffer layer 104. In the present embodiment, a ratio of a size of the region of the buffer layer 104 which is covered by the mask layer 105 to a size of the region of the buffer layer 104 which is not covered by the mask layer 105 is not limited and may be any size ratio based on actual demands.

Figure 3:
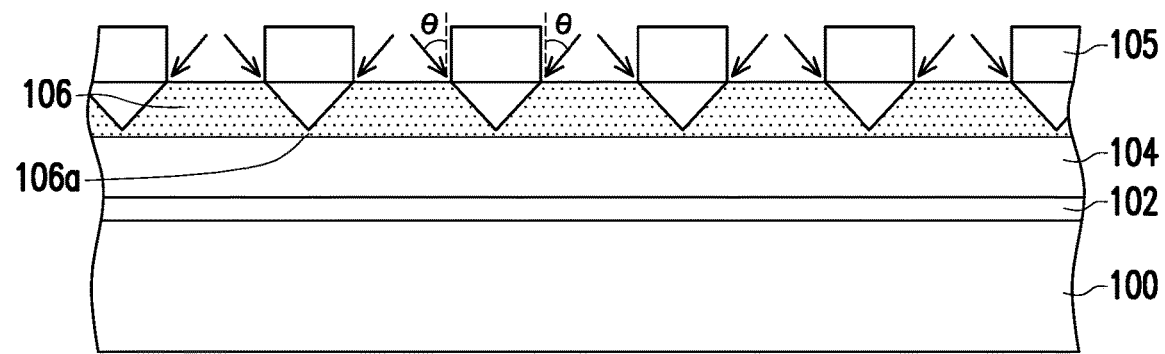
FIG. 3 is a schematic cross-sectional view of forming the doped regions in the buffer layer according to another embodiment of the invention.

Further, in the aforementioned implantation process, the neutral atoms are vertically implanted, and thus, the doped regions 106 are not formed under the mask layer 105, but the invention is not limited thereto. In other embodiments, the neutral atoms may be implanted into the buffer layer 104 in a tilt implantation manner. An implantation angle θ of the neutral atoms may be, for example, smaller than 20 degrees, but the invention is not limited thereto. In this way, not only the doped regions 106 may be formed, but also the doped regions 106a may be formed in the buffer layer 104 under the mask layer 105. Namely, a doped region 106a is provided between each adjacent doped regions 106, as illustrated in FIG. 3. Based on characteristics of the tilt implantation, a thickness of the doped regions 106a is less than a thickness of the doped regions 106. The purpose of forming the doped regions 106a lies in forming an insulation layer with higher resistance, thereby suppressing a leakage current phenomenon generated by the buffer layer 104.

Afterwards, referring to FIG. 1B, the mask layer 105 is removed. Then, a GaN layer 108 is formed on the buffer layer 104. A method of forming the GaN layer 108 includes, for example, performing an epitaxial growing process. The GaN layer 108 includes regions 108a which are located on the doped regions 106 and regions 108b which are not located on the doped regions 106. Defects may be formed in the doped regions 106 after the doped regions 106 are formed by implanting the neutral atoms, and thus, when the GaN layer 108 is formed by the epitaxial growing process, quality of the GaN layer 108 (in the regions 108a) which is formed on the doped regions 106 is inferior to that of the GaN layer 108 (in the regions 108b) which is not formed on the doped regions 106. Thereafter, a mask layer 110 is formed on the GaN layer 108. The mask layer 110 is located on the regions 108a. Namely, the mask layer 110 covers a portion of the GaN layer 108 which has poor quality. A material of the mask layer 110 includes, for example, a dielectric material, such as silicon nitride or silicon oxide.

Afterwards, referring to FIG. 1C, a GaN layer 112 is formed on the GaN layer 108. A method of forming the GaN layer 112 includes, for example, performing an epitaxial growing process. In the present embodiment, as the regions 108a in the GaN layer 108 which have poor quality are covered by the mask layer 110, the GaN layer 112, when being formed, starts to grow from the regions 108b in the GaN layer 108 which have better quality. In addition, based on characteristics of the epitaxial growing, when the GaN layer 112 starts to grow from the regions 108b to more than a height of a top surface of the mask layer 110, a horizontal growth phenomenon occurs, such that the finally formed GaN layer 112 is capable of covering the mask layer 110, and as the top surface of the mask layer 110 does not have the defects like those in the doped regions 106, the entire GaN layer 112 may have better quality. In this way, the GaN layer 112 may be employed as a channel layer of the finally formed device and may contribute to improving electronic transmission performance of the device due to having preferable quality.

It is to be mentioned that in the step illustrated in FIG. 1B, after the mask layer 105 is removed, the GaN layer 108 is first formed on the buffer layer 104, and the mask layer 110 is then formed on the GaN layer 108, but the invention is not limited thereto. In a condition that a material of the buffer layer 104 includes GaN, the step of forming the GaN layer 108 may be omitted, and the mask layer 110 is directly formed on the buffer layer 104. In this circumstance, the mask layer 110 covers the doped regions 106 having the defects. Then, the GaN layer 112 is formed, as illustrated in FIG. 1C. In this circumstance, the GaN layer 112 is formed on the buffer layer 104. As the doped regions 106 having the defects are covered by the mask layer 110, the GaN layer 112, when being formed, starts to grow from the buffer layer 104 made of the GaN material. Similarly, based on characteristics of the epitaxial growing, the finally formed GaN layer 112 is capable of covering the mask layer 110, and the entire GaN layer 112 may have better quality.

Up to this step, the manufacture of the semiconductor substrate 10 of the present embodiment is completed. The semiconductor substrate 10 which includes the buffer layer 104 with higher resistance and the GaN layer 112 with preferable quality may be applied in various GaN-based semiconductor devices, which is not limited in the invention.

FIG. 2A to FIG. 2D are schematic cross-sectional views of a manufacturing method of a semiconductor substrate according to a second embodiment of the invention. In the present embodiment, elements which are the same as those in the first embodiment will be represented by the same symbols and will be no longer described.

Figure 2A:
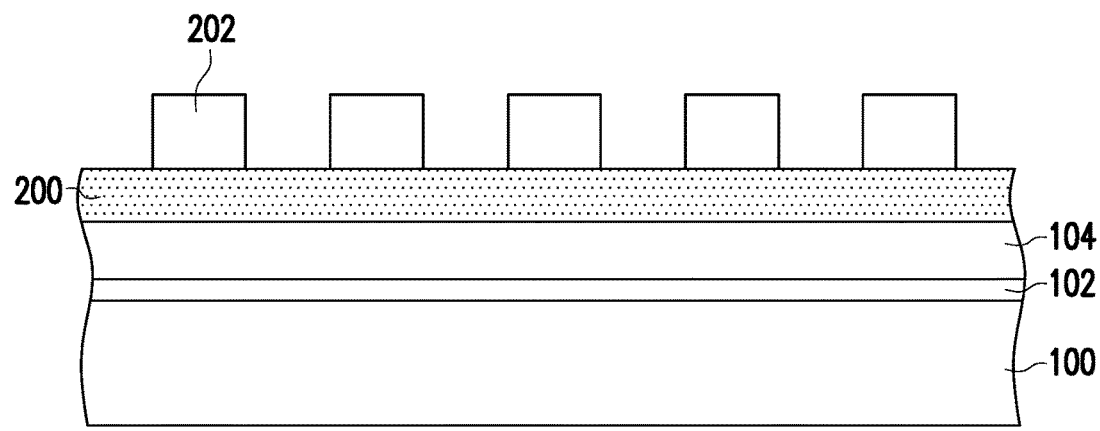
FIG. 2A to FIG. 2D are schematic cross-sectional views of a manufacturing method of a semiconductor substrate according to a second embodiment of the invention.

First, referring to FIG. 2A, a nucleation layer 102 is formed on a base 100. Then, a buffer layer 104 is formed on the nucleation layer 102. Thereafter, an implantation process is performed to implant neutral atoms into an overall surface of the buffer layer 104, so as to form doped regions 200. In the present embodiment, the neutral atoms include, for example, N or Ar. After the neutral atoms are implanted, the buffer layer 104 may be amorphized, such that the buffer layer 104 has a higher resistance, and a finally formed device may have a lower leakage current. Additionally, in the present embodiment, only the neutral atoms are implanted into the surface of the buffer layer 104, but a depth of the buffer layer 104 is not limited in the invention. In other embodiments, the neutral atoms may also be implanted deeply into the bottom of the buffer layer 104. Namely, the depth of formed doped regions 200 may be equal to the thickness of the buffer layer 104. Then, a mask layer 202 is formed on the buffer layer 104. The mask layer 202 covers a portion of the buffer layer 104. A material of the mask layer 202 includes, for example, a dielectric material, such as silicon nitride or silicon oxide.

Figure 2B:
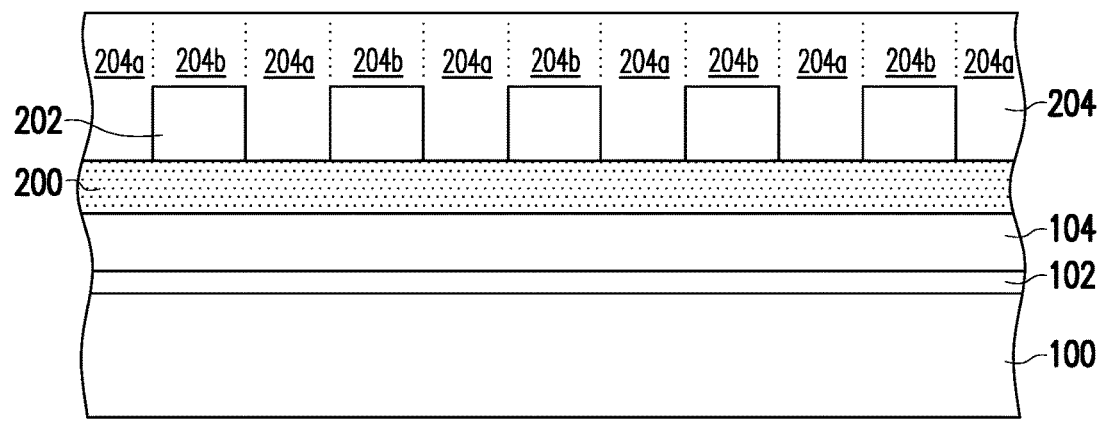

Afterwards, referring to FIG. 2B, a GaN layer 204 is formed on the buffer layer 104. A method of forming the GaN layer 204 includes, for example, performing an epitaxial growing process. The GaN layer 204 includes regions 204a which are not located on the mask layer 202 and regions 204b which are located on the mask layer 202. Defects may be formed in the doped regions 200 after the doped regions 200 are formed by implanting the neutral atoms, and thus, when the GaN layer 204 is formed by the epitaxial growing process, the GaN layer 204 (in the regions 204a) which is formed on the doped regions 200 may have poor quality. However, based on characteristics of the epitaxial growing, when the GaN layer 204 starts to grow from surfaces of the doped regions 200 to more than a height of a top surface of the mask layer 202, a horizontal growth phenomenon occurs, and as the top surface of the mask layer 202 does not have the defects like those in the doped regions 200, the GaN layer 204 (in the regions 204b) formed on the mask layer 202 may be better quality.

Figure 2C:
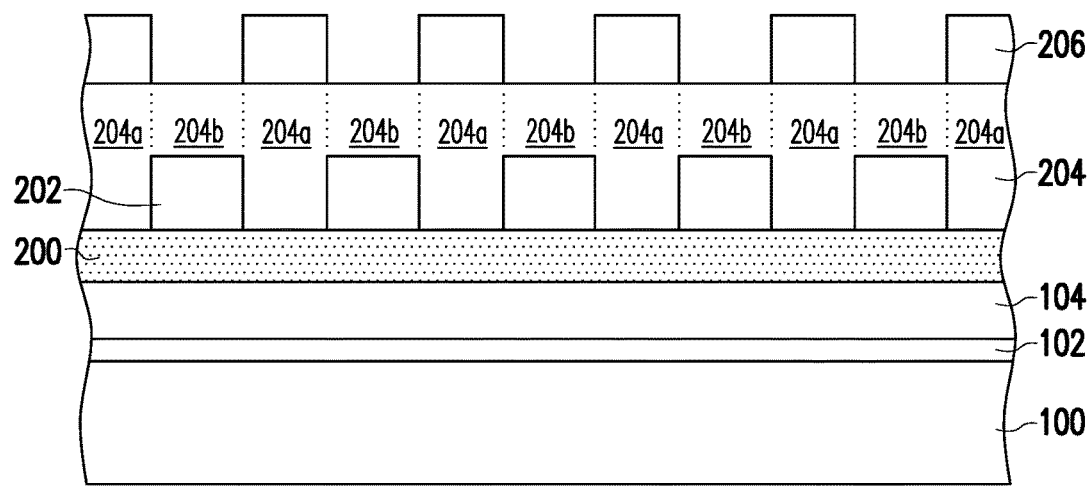

Then, referring to FIG. 2C, a mask layer 206 is formed on the GaN layer 204. The mask layer 206 is located on the doped regions 200 which are not covered by the mask layer 202. Namely, the mask layer 206 cover a portion (i.e., the regions 204a) of the GaN layer 204 which has poor quality. A material of the mask layer 206 includes, for example, a dielectric material, such as silicon nitride or silicon oxide.

Figure 2D:
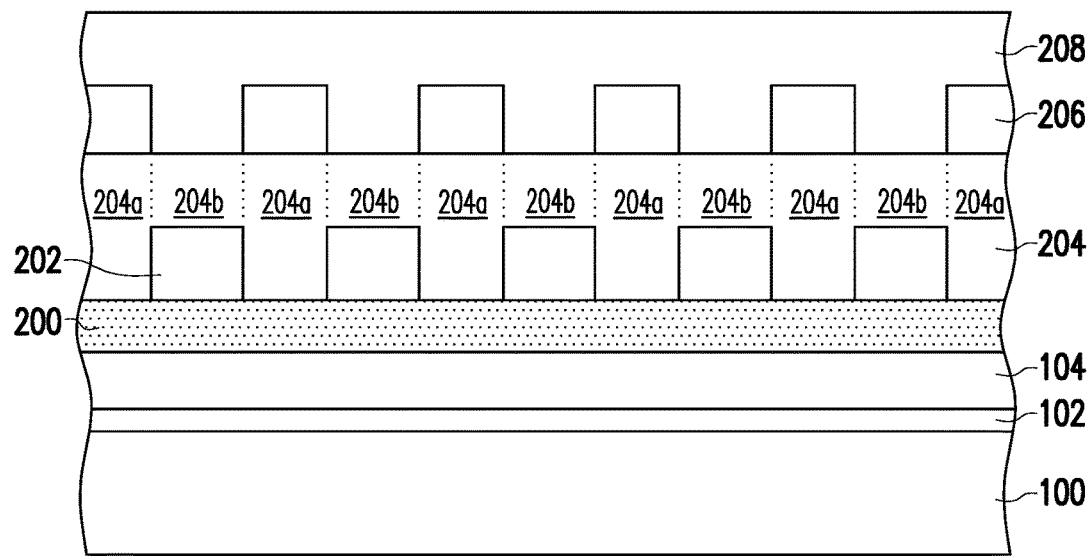

Then, referring to FIG. 2D, a GaN layer 208 is formed on the GaN layer 204. A method of forming the GaN layer 208 includes, for example, performing an epitaxial growing process. In the present embodiment, as the regions 204a in the GaN layer 204 which have poor quality are covered by the mask layer 206, the GaN layer 208, when being formed, starts to grow from the regions 204b in the GaN layer 204 which have preferable quality. In addition, based on characteristics of the epitaxial growing, when the GaN layer 208 starts to grow from the regions 204b to more than the height of the top surface of the mask layer 206, a horizontal growth phenomenon occurs, such that the finally formed GaN layer 208 is capable of covering the mask layer 206, and as the top surface of the mask layer 206 does not have the defects like those in the doped regions 200, the entire GaN layer 208 may have better quality. In this way, the GaN layer 208 may be employed as a channel layer of the finally formed device and may contribute to improving electronic transmission performance of the device due to having preferable quality.

Up to this step, the manufacture of the semiconductor substrate 20 of the present embodiment is completed. The semiconductor substrate 20 including the buffer layer 104 with high resistance and the GaN layer 208 with preferable quality may be applied in various GaN-based semiconductor devices, which is not limited in the invention.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor substrate, comprising:
   a base;
   a buffer layer, disposed on the base, wherein doped regions are disposed in a portion of a surface of the buffer layer and the doped regions are separated from each other;
   a mask layer, disposed on the buffer layer and located on the doped regions; and
   a first GaN layer, disposed on the buffer layer and covering the mask layer.

2. The semiconductor substrate as recited in claim 1, wherein a dopant of the doped regions comprises neutral atoms.

3. The semiconductor substrate as recited in claim 2, wherein the neutral atoms comprise N or Ar.

4. The semiconductor substrate as recited in claim 1, wherein the base comprises a Si base, a SiC base, a sapphire base or a GaN base.

5. The semiconductor substrate as recited in claim 1, wherein a material of the buffer layer comprises GaN, AlGaN, InGaN or AlInGaN.

6. The semiconductor substrate as recited in claim 5, further comprising a second GaN layer disposed between the buffer layer and the first GaN layer.

7. A manufacturing method of a semiconductor substrate, comprising:
   forming a buffer layer on a base;
   forming doped regions in a portion of a surface of the buffer layer, wherein the doped regions are separated from each other;
   forming a mask layer on the buffer layer, wherein the mask layer is located on the doped regions; and
   forming a first GaN layer on the buffer layer, wherein the first GaN layer covers the mask layer.

8. The manufacturing method of the semiconductor substrate as recited in claim 7, wherein a dopant of the doped regions comprises neutral atoms.

9. The manufacturing method of the semiconductor substrate as recited in claim 8, wherein the neutral atoms comprise N or Ar.

10. The manufacturing method of the semiconductor substrate as recited in claim 7, wherein a method of forming the first GaN layer comprises performing an epitaxial growing process.

11. The manufacturing method of the semiconductor substrate as recited in claim 7, wherein after the doped regions are formed, and before the mask layer is formed, the manufacturing method further comprises forming a second GaN layer on the buffer layer.

* * * * *